(12) United States Patent
Ko

(10) Patent No.: US 7,875,929 B2
(45) Date of Patent: Jan. 25, 2011

(54) SEMICONDUCTOR DEVICE AND METHOD FOR MANUFACTURING THE SAME

(75) Inventor: Kwang-Young Ko, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 441 days.

(21) Appl. No.: 11/944,586

(22) Filed: Nov. 23, 2007

(65) Prior Publication Data

US 2008/0150016 A1    Jun. 26, 2008

(30) Foreign Application Priority Data

Dec. 20, 2006   (KR) .................. 10-2006-0131435

(51) Int. Cl.
*H01L 29/78* (2006.01)
(52) U.S. Cl. ............... 257/342; 257/622; 257/E29.256; 257/E29.268
(58) Field of Classification Search .......... 257/335, 257/330, 321.41, E29.257, E29.259, E29.26, 257/E29.261, E29.027, 329, 336, 343, 337, 257/342, 618, 622, 623, E29.105, E29.226, 257/E29.242, E29.255, E29.256, E29.268
See application file for complete search history.

(56) References Cited

U.S. PATENT DOCUMENTS

| | | | | |
|---|---|---|---|---|
| 6,046,474 A | * | 4/2000 | Oh et al. | 257/343 |
| 6,900,101 B2 | * | 5/2005 | Lin | 438/276 |
| 6,909,143 B2 | * | 6/2005 | Jeon et al. | 257/335 |
| 2005/0142786 A1 | * | 6/2005 | Sung | 438/306 |
| 2007/0045767 A1 | * | 3/2007 | Zhu et al. | 257/505 |

* cited by examiner

*Primary Examiner*—Lynne A Gurley
*Assistant Examiner*—Peter Loxas
(74) *Attorney, Agent, or Firm*—Sherr & Vaughn, PLLC

(57) ABSTRACT

A semiconductor device including a well region formed in a silicon substrate; a trench exposing a predetermined portion of the uppermost surface of the semiconductor substrate; a body layer formed in the semiconductor substrate at the trench; a device isolation layer formed in the well region; a gate insulating layer formed in the trench over the body layer; a gate electrode formed in the trench over the gate insulating layer and against the device isolation layer; a lightly doped drain region formed in the body layer; an insulating layer formed in the trench over the lightly doped drain region; a source region formed in the body layer; a drain region formed in the well region against the device isolation layer; and a body region formed in the body layer against the source region. The on-resistance can be reduced by forming the gate and source beneath the device isolating layer.

7 Claims, 5 Drawing Sheets

SEMICONDUCTOR DEVICE AND METHOD FOR MANUFACTURING THE SAME

The present application claims priority under 35 U.S.C. 119 to Korean Patent Application No. 10-2006-0131435 (filed on Dec. 20, 2006), which is hereby incorporated by reference in its entirety.

BACKGROUND

A MOS field effect transistor (MOSFET) may offer numerous advantages such as a high input impedance over a bipolar transistor, a large power gain and a simple structure for a gate driving circuit since it is a unipolar device, and does not generate a time delay due to the accumulation or the recombination of a minority carrier. Accordingly, MOSFETs have applicability as a switching mode power supply, a lamp ballast and a motor driving circuit.

A power MOSFET, a double diffused MOSFET structure (DMOSFET) using planar diffusion technique has been widely used. It may be important for the DMOS transistors to apply to a power device capable of processing high voltage. An advantage of DMOSFETs is current handling capacity per unit area or on-resistance per unit area. Since voltage ratio may be fixed, the on-resistance per unit area can be reduced as the cell area of the MOS device is reduced.

In the field of the power transistor, the cell pitch thereof may be defined by a coupled width of poly crystalline silicon (polysilicon) and a contact region forming gate and source electrodes, respectively.

The width of the polysilicon region of a DMOS power transistor can be accomplished by reducing a junction depth of a p-type well. The minimum junction depth may be defined by a required breakdown voltage.

An LDMOS device may be suitable for applying to a VLSI process due to its simple structure. However, such LDMOS devices exhibit poor characteristics as compared to a vertical DMOS (VDMOS). With the development of reduced surface field (RESURF) LDMOS devices, the LDMOS devices have obtained excellent on-resistance (Rsp). However, the structure of the RESURF device may be applied only to source-grounded devices and may be very complicated.

DMOS transistors have been used as a discontinuous power transistor or components in a monolithic integrated circuit. In order to prepare a self-aligned channel region along with a gate, a channel body region may be formed by the implantation of a dopant (p-type or n-type impurity) through apertures in a mask made of a gate forming material.

A source region may be formed by implanting a dopant through the apertures, the dopant having a conductivity opposite to the conductivity of the channel body region. The source may be self-aligned to both of the gate electrode and the channel body region to derive a relatively compact structure.

Figure 1:
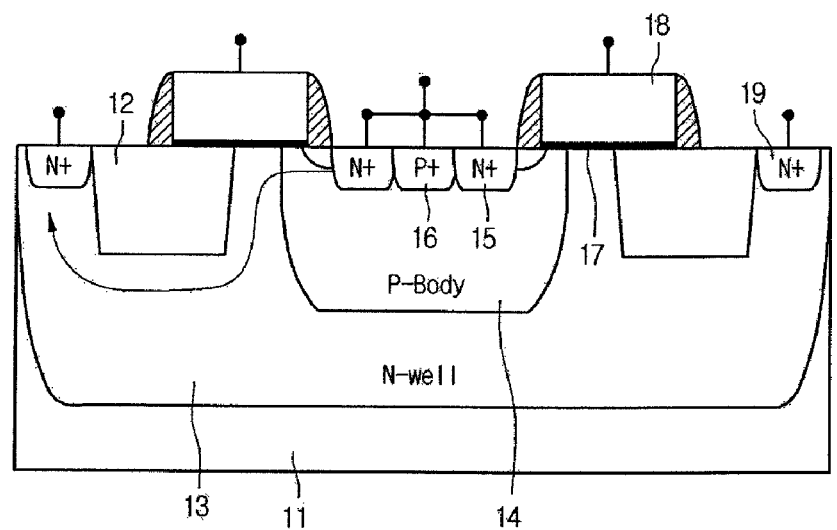

As illustrated in example in FIG. 1, an LDMOS semiconductor device may include STI-type device isolating layer 12 formed in an active region and a device isolating region of silicon substrate 11, which is defined as a device isolating region. $N^+$ well region 13 may be formed in the surface of silicon substrate 11 at a predetermined depth. $P^+$ body layer 14 may be formed in the surface of silicon substrate 11 formed with $N^+$ well region 13. A plurality of source regions ($N^+$) 15 may be formed in the surface of $P^+$ body layer 14 at a predetermined interval. $P^+$ body region 16 may be formed in P-body layer 14 between source regions ($N^+$) 15. Gate electrode 18 may be formed by having a predetermined interval. Gate insulating layer 17 may be formed laterally to a side of source region ($N^+$) 15. Drain region ($N^+$) 19 may be formed in N-well region 13 laterally with respect to gate electrode 18.

Such an LDMOS device may utilize device isolating layer 12 as a filed plate in order to obtain high voltage by reducing field in an edge portion of gate electrode 18. However, such a structure may result in an increase in on-resistance due to an increase of the current path.

SUMMARY

Embodiments relate to a semiconductor device that has a reduced on-resistance by forming a gate and an STI-type device isolating layer having coplanar tops and bottoms, while a source is below them both.

Embodiments relate to a semiconductor device that can include: a well region formed in a silicon substrate; a trench exposing a predetermined portion of the uppermost surface of the semiconductor substrate; a body layer formed in the semiconductor substrate at the trench; a device isolation layer formed in the well region; a gate insulating layer formed in the trench over the body layer; a gate electrode formed in the trench over the gate insulating layer and against the device isolation layer; a lightly doped drain region formed in the body layer; an insulating layer formed in the trench over the lightly doped drain region; a source region formed in the body layer; a drain region formed in the well region against the device isolation layer; and a body region formed in the body layer against the source region.

Embodiments relate to a method for manufacturing a semiconductor device that can include at least one of the following steps: forming a well region in a semiconductor substrate; forming a trench in the semiconductor substrate; forming a device isolation layer in the trench; forming a gate insulating layer in the trench over the well region; forming a gate electrode in the trench against the device isolating layer and over the gate insulating layer; forming a body layer in the well region; forming body region in the body layer; forming a source region at the trench in the body layer against the body region; and then forming a drain region in the well region against the device isolation layer.

Embodiments relate to a method for manufacturing a semiconductor device that can include at least one of the following steps: forming a device isolating layer over a silicon substrate using an STI process; forming a trench in the silicon substrate by removing a portion of the device isolating layer; forming a body layer by implanting impurity ion within the surface of the silicon substrate in which the open part is formed; forming a gate electrode by interposing a gate insulating layer in the side surface of the device isolating layer of both sides of the open part; and then forming a source region and a drain region within the body layer of one side of the gate electrode and the surface of the silicon substrate.

DRAWINGS

Example FIG. 1 illustrates an LDMOS semiconductor device.

Figure 2:
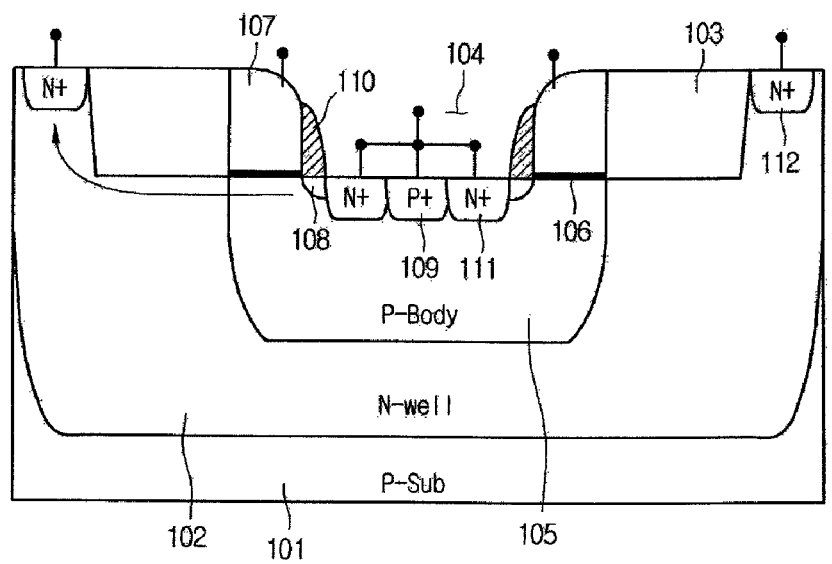

Example FIG. 2 illustrates an LDMOS semiconductor device, in accordance with embodiments.

Example FIGS. 3 to 4 illustrate a method for manufacturing a semiconductor device, in accordance with embodiments.

DESCRIPTION

As illustrated in example FIG. 2, an LDMOS semiconductor device in accordance with embodiments can include N-well region 102 formed within a surface of silicon substrate 101. Device isolating layer 103 may be formed within the surface of silicon substrate 101 including N-well region 102. Trench 104 exposing a predetermined portion of an upper surface of silicon substrate 101 may be formed by selectively removing portions of device isolating layer 103. P-body layer (P$^+$) 105 may be formed beneath trench 104 of silicon substrate 101. Gate insulating layers 106 may be formed on and/or over p-body layer 105 against the side surface of a respective device isolating layer 103. Gate electrode 107 may be formed on and/or over gate insulating layers 106.

LDD regions 108 may be formed in p-body layer (P$^+$) 105. Sidewall 110 of an insulating layer may be formed against the side surface of the gate electrode 107 and on and/or over LDD region 108. A pair of source regions (N$^+$) 111 may be formed in p-body layer (P$^+$) 105 against a respective LDD region 105. A pair of drain regions (N$^+$) 112 may be formed in N-well region 102 against a respective device isolation layer 103. P-body region (P$^+$) 109 may be formed between source regions (N$^+$) 111.

Gate electrode 107 may be formed at lower height than that of the uppermost surface of device isolating layer 103.

Figure 3A:
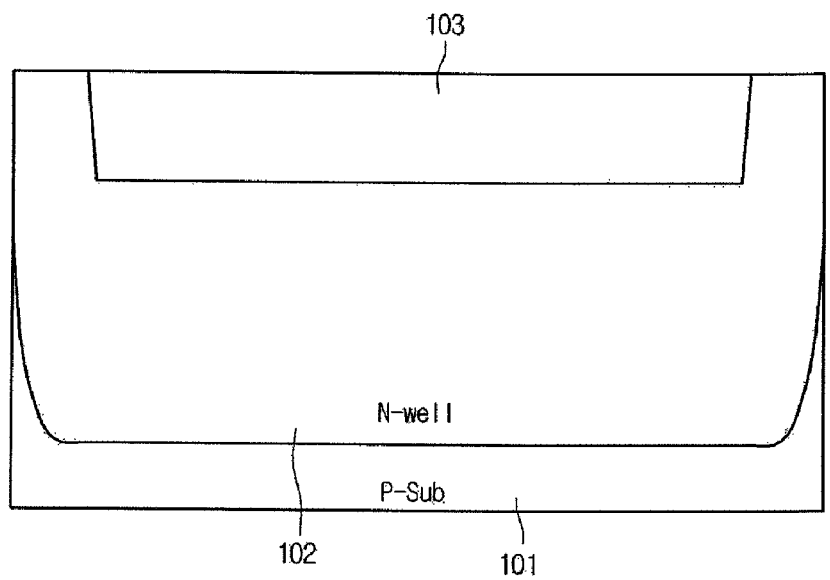

As illustrated in example FIG. 3A, N-well region 102 may be formed within a surface of silicon substrate 101. Silicon substrate may be a p-type silicon (Si) substrate 101. N-well region 102 may be formed by implanting an N-type impurity ion into p-type silicon (Si) substrate 101.

Thereafter, a pair of trenches may be formed in the surface at a predetermined depth by selectively removing a portion of silicon substrate 101 using photolithographic and etching processes.

Then, an insulation material may be formed on and/or over the whole surface of silicon substrate 101 including the trenches and a planarization process such as a CMP process may be performed on the whole surface thereof to form a pair of device isolating layers 103 in a respective trench.

Figure 3B:
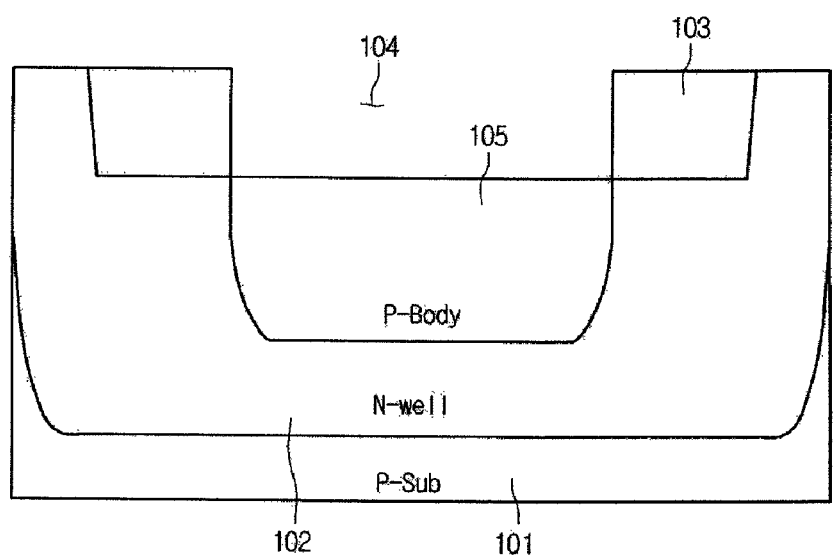

As illustrated in example FIG. 3B, a trench 104 exposing the surface of silicon surface 101 may be formed by selectively removing a portion of device isolating layer 103 using photolithographic and etching processes. Next, P-body layer 105 may be formed by implanting a p-type impurity into silicon substrate 101 at the trench 104.

Figure 3C:
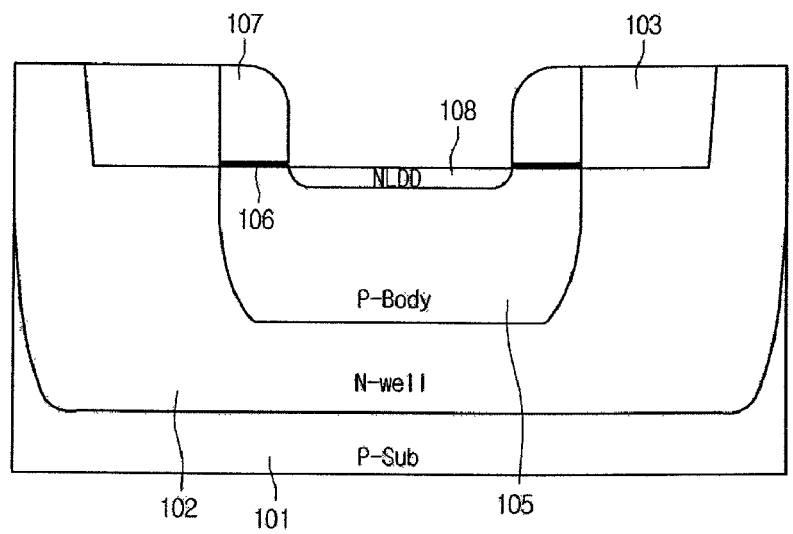

As illustrated in example FIG. 3C, gate insulating layer 106 and a polysilicon layer may be sequentially formed on and/or over the whole surface of silicon substrate 101 including the device isolating layer 103. Thereafter, an etch back process can be performed on and/or over the whole surface of silicon substrate 101 to form gate electrode 107 against the inner peripheral surface of each device isolating layer 103. Then, low-concentration n-type impurity ions can be implanted into P-body layer 105 using a sidewall of gate electrode 107 as a mask to form LDD region 108.

Figure 3D:
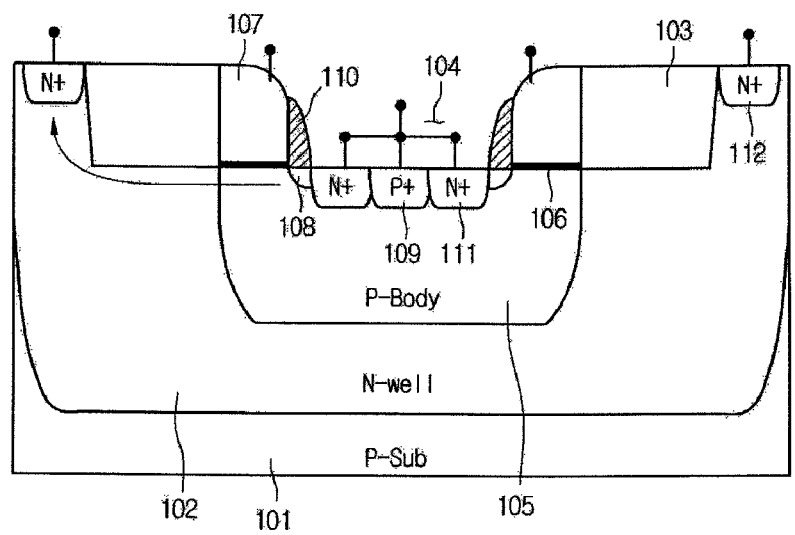

As illustrated in example FIG. 3D, high-concentration p-type impurity ions can be implanted into P-body layer 105 of silicon substrate 101 to form p$^+$-type body region 109. Thereafter, an insulating layer can be formed on and/or over the whole surface of silicon substrate 101 and an etch back process can then be performed thereon to form sidewall 110 of the insulating layer against the inner peripheral surface of gate electrode 107. High-concentration n-type impurity ions for a source/drain can be implanted into silicon substrate 101 to form in silicon surface 101 a pair of N+ source regions 111 between LDD region 108 and p$^+$-type body region 109, respectively, and a pair of N+ drain regions 112 against device isolation layer 103, respectively. Accordingly, an LDMOS semiconductor device is completed.

Figure 4A:
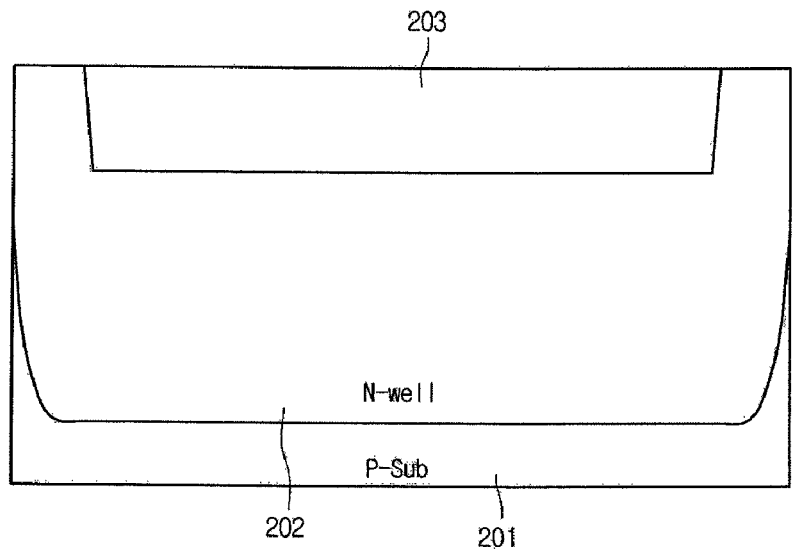

As illustrated in example FIG. 4A, N-well region 202 can be formed in silicon substrate 201. N-well region can be formed by implanting N-type impurity ions into a silicon semiconductor substrate 201. Semiconductor substrate 201 can be composed of p-type silicon. Thereafter, a trench having a predetermined depth can be formed in semiconductor substrate 201 by selectively removing a portion of silicon substrate 201 using a photolithographic process and an etching process. An insulation material can be formed on and/or over silicon substrate 201 including the trench and a planarization process such as a CMP process can be performed on the whole surface thereof to form device isolating layer 203 in the trench.

Figure 4B:
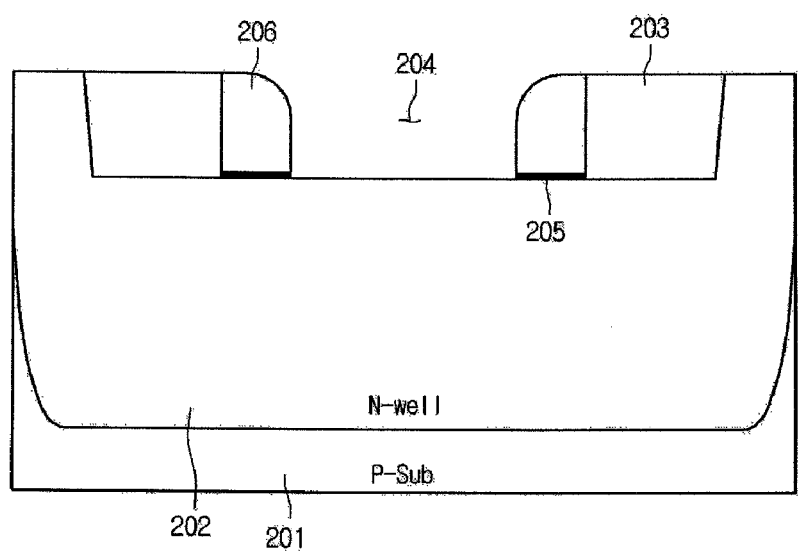

As illustrated in example FIG. 4B, an trench 204 exposing the uppermost surface of semiconductor substrate 201 can be formed by selectively removing a portion of device isolating layer 203 using a photolithographic process and an etching process. Then, gate insulating layer 205 and a polysilicon layer can be sequentially formed in trench 204 and on and/or over silicon substrate 201. Thereafter, an etch back process can be performed on silicon substrate 201 to form gate electrode 206 against an inner peripheral surface of device isolating layer 203 and on and/or over gate insulating layer 205.

Figure 4C:
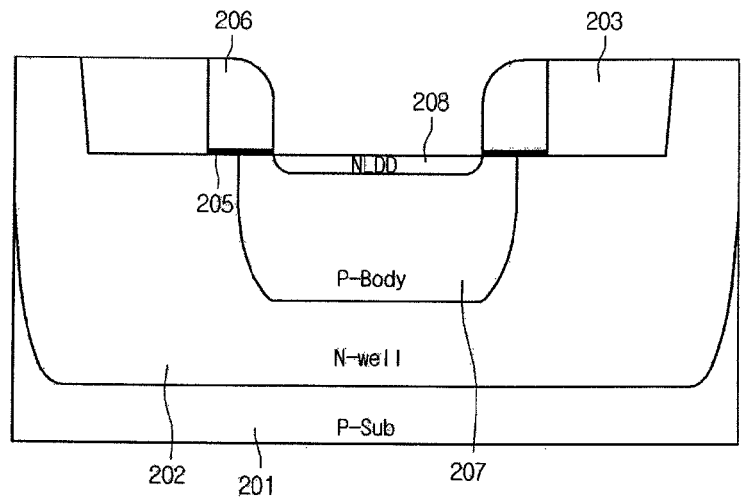

As illustrated in example FIG. 4C, p-type impurity ions can be implanted into silicon substrate 201 formed at trench 204 using gate electrode 206 as a mask to form P-body 207. Then, low-concentration n-type impurity ions can be implanted into P-body layer 207 using gate electrode 206 as a mask to form LDD region 208.

Figure 4D:
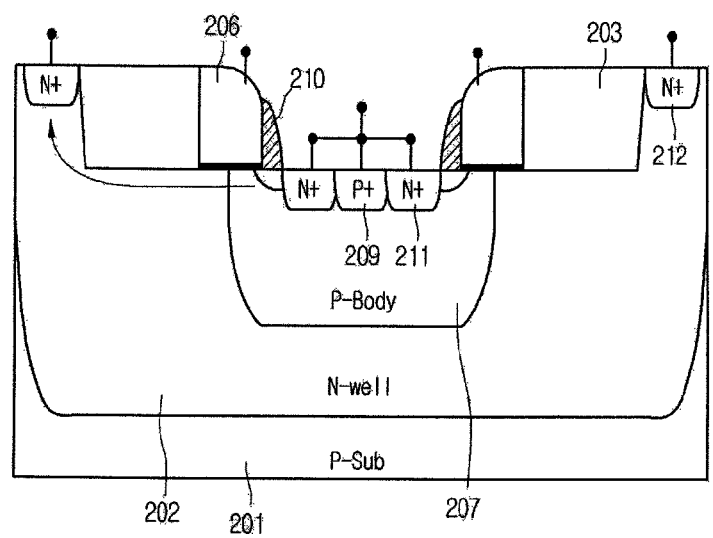

As illustrated in example FIG. 4D, an insulating layer can be formed on and/or over silicon substrate 201 including LDD region 208 and an etch back process can then be performed to form a pair of insulating sidewalls 210 against the inner peripheral surface of a respective gate electrode 206. Thereafter, high-concentration p-type impurity ions can be implanted into P-body layer 207 of the silicon substrate 201 to form p-type body region 209. A high-concentration n-type impurity ion for a source/drain can be implanted into silicon substrate 201 to form a pair of n-type source regions 211 and a pair of n-type drain regions 212 in silicon surface 201. Particularly, n-type source regions 211 can be formed against the lateral peripheral surface of p-type body region 209 and n-type drain regions can be formed against the lateral peripheral surface of device isolation layer 203. Accordingly, an LDMOS semiconductor device is completed.

In accordance with embodiments, a semiconductor device and method for manufacturing the same can effectively reduce the on-resistance by forming the gate and source in the bottom of the device isolating layer. Thereby, the characteristics of the semiconductor device can be enhanced.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a well region formed in a silicon substrate;
   a trench exposing a predetermined portion of an upper surface of the semiconductor substrate;

a body layer formed in the semiconductor substrate beneath the trench;
a device isolation layer formed in the well region;
a gate insulating layer formed in the trench over the body layer;
a gate electrode formed in the trench over the gate insulating layer and against the device isolation layer;
a lightly doped drain region formed in the body layer;
an insulating layer formed in the trench over the lightly doped drain region;
a source region formed in the body layer;
a drain region formed in the well region against the device isolation layer; and
a body region formed in the body layer against the source region.

2. The apparatus of claim 1, wherein the well region is formed by implanting an N-type impurity ion into the semiconductor substrate.

3. The apparatus of claim 1, wherein the body layer is formed by implanting a p-type impurity into the semiconductor substrate at the trench.

4. The apparatus of claim 1, wherein the lightly doped drain region is formed by implanting low-concentration n-type impurity ions into the body layer using a sidewall of the gate electrode as a mask.

5. The apparatus of claim 1, wherein the body region is formed by implanting high-concentration p-type impurity ions into the body layer.

6. The apparatus of claim 1, wherein the source region is formed by implanting high-concentration n-type impurity ions into the body layer.

7. The apparatus of claim 1, wherein the drain region is formed by implanting high-concentration n-type impurity ions into the well region.

* * * * *